(12) United States Patent
Hsieh et al.

(10) Patent No.: US 12,147,163 B2
(45) Date of Patent: Nov. 19, 2024

(54) METHOD FOR CORRECTING CRITICAL DIMENSION MEASUREMENTS OF LITHOGRAPHIC TOOL

(71) Applicant: UNITED MICROELECTRONICS CORP., Hsinchu (TW)

(72) Inventors: Hsin-Yu Hsieh, Tainan (TW);
Kuan-Ying LAi, Chiayi (TW);
Chang-Mao Wang, Tainan (TW);
Chien-Hao Chen, Tainan (TW);
Chun-Chi Yu, Taipei (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 633 days.

(21) Appl. No.: 17/528,295

(22) Filed: Nov. 17, 2021

(65) Prior Publication Data
US 2023/0152714 A1    May 18, 2023

(51) Int. Cl.
*G03F 7/00*  (2006.01)
(52) U.S. Cl.
CPC ................ *G03F 7/70625* (2013.01)
(58) Field of Classification Search
CPC .................................................. G03F 7/70625
USPC .......................................................... 430/30
See application file for complete search history.

(56) References Cited

U.S. PATENT DOCUMENTS

| | | |
|---|---|---|
| 5,106,432 A | 4/1992 | Matsumoto et al. |
| 6,094,256 A | 7/2000 | Grodnensky et al. |
| 8,781,211 B2 | 7/2014 | Ghinovker |
| 9,653,404 B1 | 5/2017 | Wang et al. |
| 2009/0195768 A1 | 8/2009 | Bijnen et al. |

*Primary Examiner* — Christopher G Young
(74) *Attorney, Agent, or Firm* — WPAT, P.C

(57) ABSTRACT

A method for correcting critical dimension (CD) measurements of a lithographic tool includes steps as follows. A correction pattern having a first sub-pattern parallel to a first direction and a second sub-pattern parallel to a second direction is provided on a lithographic mask; wherein the first sub-pattern and the second sub-pattern come cross with each other. A first After-Develop-Inspection critical dimension (ADI CD) of a developed pattern formed on a photosensitive layer and transferred from the correction pattern is measured using the lithographic tool along a first scanning direction. A second ADI CD of the developed pattern is measured using the lithographic tool along a second scanning direction. The first ADI CD is subtracted from the second ADI CD to obtain a measurement bias value. Exposure conditions and/or measuring parameters of the lithographic tool are adjusted according to the measurement bias value.

9 Claims, 3 Drawing Sheets

METHOD FOR CORRECTING CRITICAL DIMENSION MEASUREMENTS OF LITHOGRAPHIC TOOL

BACKGROUND

Technical Field

The disclosure relates to a measurements monitoring and correcting method, and more particularly to a method for monitoring and correcting the critical dimension (CD) measurements of a lithographic tool.

Description of Background

In the manufacture of integrated circuits (ICs), at least one lithographic process is generally required for the formation of any active or electrical passive element in order to define the location and the basic dimensions of the element. As the level of ICs integration continues to increase, the size of semiconductor devices shrinks correspondingly. The manufacture of ICs has relied more heavily on the accuracy of the lithographic process.

In order to confirm line widths of the pattern have been precisely transferred to the photo-sensitive layer, quality inspections including a CD measurement may be required. However, the diffraction of the focused electron beam provided by a Scanning Electron Microscope (SEM) used to perform the CD measurement may cause measuring bias, which can deteriorate the reliability of the quality inspections.

Therefore, there is a need of providing a method for correcting CD measurements of a lithographic tool to obviate the drawbacks encountered in the prior art.

SUMMARY

One aspect of the present disclosure is to provide a method for correcting CD measurements of a lithographic tool, wherein the method includes steps as follows. A correction pattern having a first sub-pattern parallel to a first direction and a second sub-pattern parallel to a second direction is provided on a lithographic mask; wherein the first sub-pattern and the second sub-pattern come cross with each other. A first After-Develop-Inspection critical dimension (ADI CD) of a developed pattern transferred from the correction pattern and formed on a photo-sensitive layer is measured using the lithographic tool along a first scanning direction. A second ADI CD of the developed pattern is measured using the lithographic tool along a second scanning direction. The first ADI CD is subtracted from the second ADI CD to obtain a measurement bias value. Exposure conditions of the lithographic tool are adjusted according to the measurement bias value.

In accordance with the aforementioned embodiments of the present disclosure, a method for correcting CD measurements of a lithographic tool is provided. A correction pattern having a first sub-pattern and a second sub-pattern intersect with each other is formed on a lithographic mask. After exposure/development, at least two ADI CDs of a developed pattern transferred from the correction pattern and formed on a photo-sensitive layer are measured using the lithographic tool along different scanning directions. A measurement bias value can be obtained by accountings the difference between these two ADI CDs measured along difference scanning directions. Therefore, the exposure conditions and/or measuring parameters of the lithographic tool can be adjusted according to the measurement bias value to alleviate the measurement bias resulted either from the diffraction of the focused electron beam used for measuring the ADI CD or from the developing light used for forming the developed pattern, so as to enhance the processing quality of the lithographic process.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
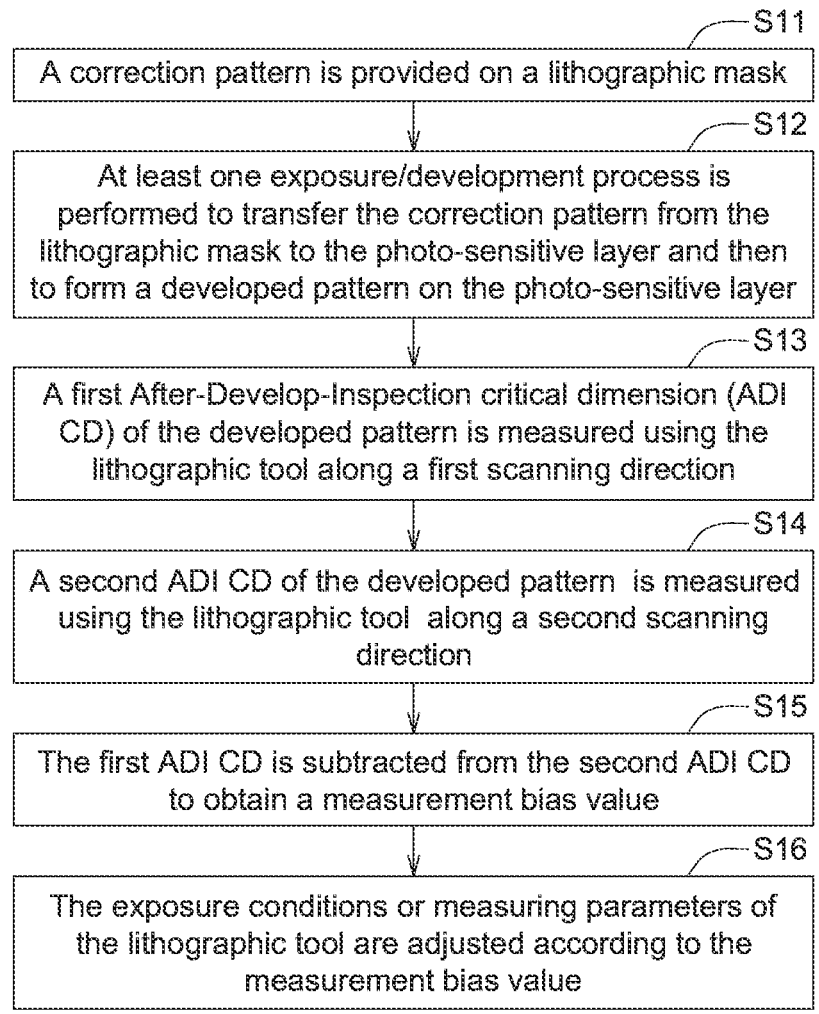
FIG. 1 is a flowchart illustrating a method for correcting CD measurements of a lithographic tool, according to one embodiment of the present disclosure.

The embodiments as illustrated below provide a method for correcting CD measurements of a lithographic tool, to enable the lithographic tool to alleviate the measurement bias and enhance the processing quality of the lithographic process. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

A lithographic process generally includes exposure of a photo-sensitive layer, such as a photoresist layer, using a lithographic tool to accurately produce an image on the photo-sensitive layer by some form of energy, such as light bean, charged particles or x-rays, so as to transfer a pattern of a lithographic mask or reticle to the photo-sensitive layer. The photo-sensitive layer is subsequently developed to remove some selected (or unselected) areas, thereby leaving portions of the underlying layer, such as a semiconductor substrate, exposed to allow subsequent processes, such as an etching process or an ion implantation process, performed thereon.

In order to confirm all line widths of the pattern have been precisely transferred to the photo-sensitive layer, quality inspections may be required, including using a Scanning Electron Microscope (SEM) after development to measure an After-Develop-Inspection critical dimension (ADI CD) of the pattern transferred to the photo-sensitive layer. During the measurements of the ADI CD, a highly focused electron beam is used to scan the surface of the developed photo-sensitive layer, the electronic signal can be obtained by measuring the electron beam scattered by the remaining portion of the developed photo-sensitive layer and the underlying layer not covered by the developed photo-sensitive layer with a detector, and the ADI CD can be obtained by figuring the correlation between the scanning distance and the electronic signal of the developed photo-sensitive layer and the underlying layer.

However, the diffraction of the focused electron beam may cause measuring bias of the ADI CD measurements, which can deteriorate the reliability of the quality inspections. Typically, the measuring bias can be observed by the factors that when an optical proximity correction (OPC) is performed along the vertical direction of the pattern, the Scatterometry critical dimension (SCD) obtained may away off from the SCD obtained by the OPC performed along the horizontal direction.

In addition, during the exposure process, the light that is projected onto the lithographic mask may diverge and spread due to diffraction (which may be refereed as to a proximity effect). Meanwhile, a portion of the light passing through the lithographic mask may penetrate the photo-sensitive layer and be reflected back by the underlying layer causing some light interference. Hence, multiple exposure of the photo-sensitive layer may make the pattern transferred to the photo-sensitive layer deformed and further contribute the measuring bias of the ADI CD measurements.

How to alleviate the measuring bias due to either the developing light or the focused electron beam should be an important issue in the pertinent technical field.

FIG. 1 is a flowchart illustrating a method for correcting CD measurements of a lithographic tool, according to one embodiment of the present disclosure. The method for correcting CD measurements of the lithographic tool includes steps as follows. Firstly, referring to step S11, a correction pattern 101 is provided on a lithographic mask 100.

Figure 2:
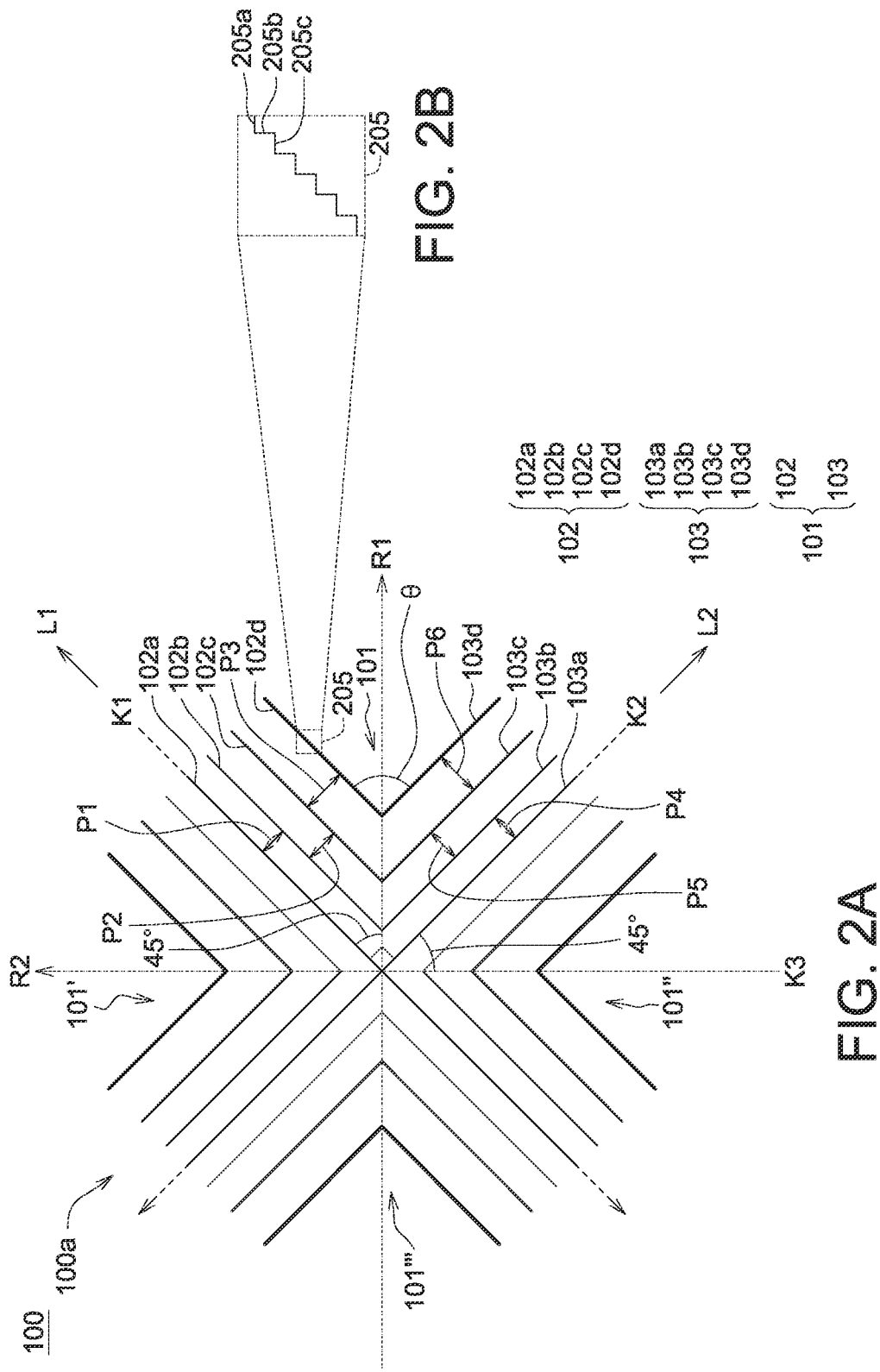
FIG. 2A is a top view illustrating a correction pattern formed on a lithographic mask and used for correcting the CD measurements of a lithographic tool.
FIG. 2B is a partial enlarged view illustrating a vertical stepped structure formed on a first sub-pattern of the correction pattern as depicted in FIG. 2A.

FIG. 2A is a top view illustrating a correction pattern 101 formed on a lithographic mask 100 and used for correcting the CD measurements of the lithographic tool. In some embodiments of the present disclosure, the correction pattern 101 includes a first sub-pattern 102 extending along a first direction L1 and a second sub-pattern 103 extending along a second direction L2, wherein the first sub-pattern 102 and the second sub-pattern 103 intersect with each other; and the first direction and the second direction make a non-180° angle θ.

For example, in some embodiments of the present disclosure, the first direction L1 is perpendicular to the second direction L2. In other words, the non-180° angle θ is a 90° angle. However, the non-180° angle θ is not limited thereto. In some other embodiments, the non-180° angle θ can be a non-90° angle.

Figure 3:
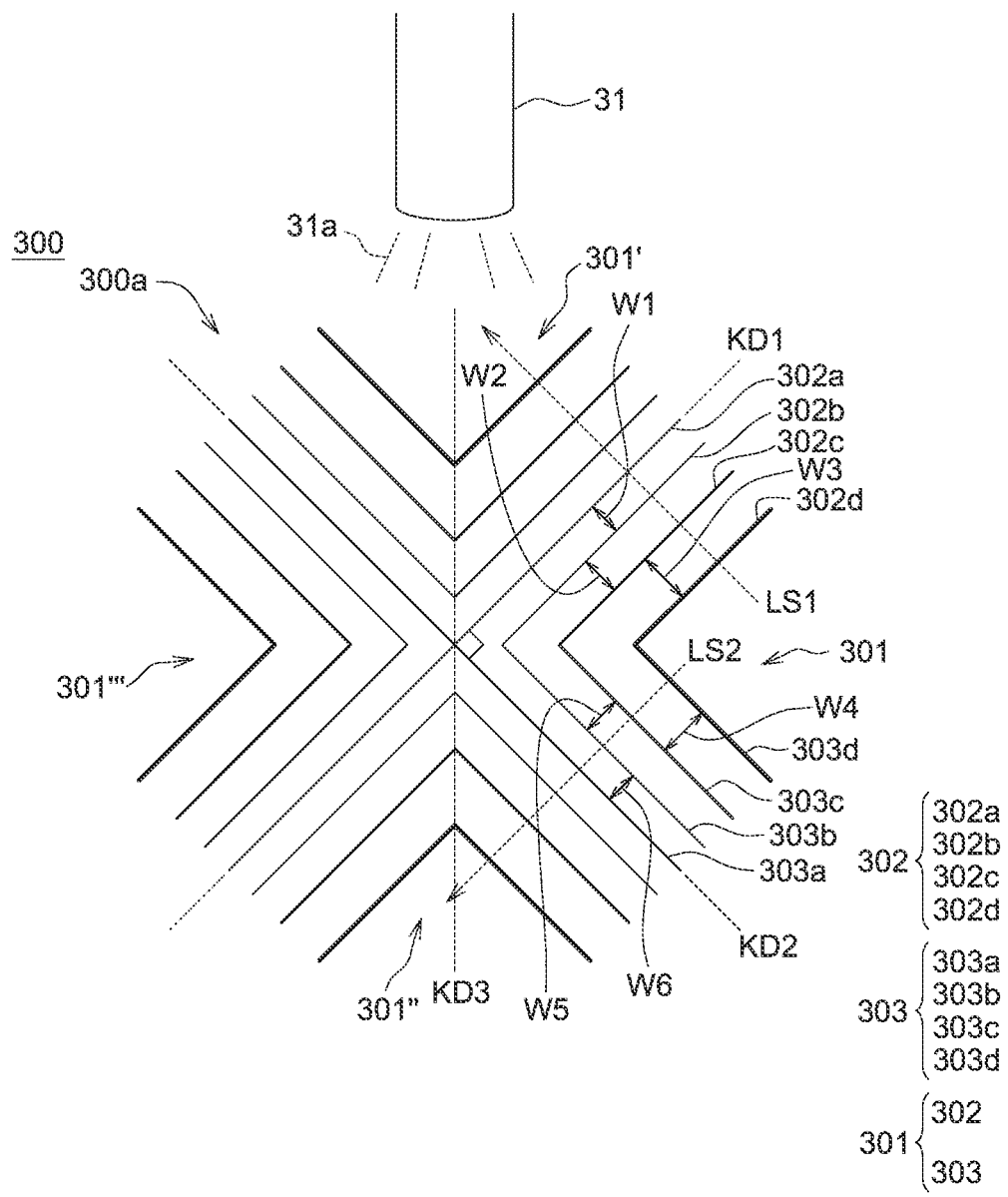
FIG. 3 is a top view illustrating a developed pattern transferred from the correction pattern as depicted in FIG. 1 and formed on a photo-sensitive layer according to one embodiment of the present disclosure.

FIG. 3 is a top view illustrating a developed pattern 301 transferred from the correction pattern 101 as depicted in FIG. 1 and formed on a photo-sensitive layer 300 according to one embodiment of the present disclosure. In the present embodiment, the developed pattern 301 corresponds to the correction pattern 101, the correction pattern 101 is formed on a peripheral area 100a of the lithographic mask 100, the developed pattern 301 is formed on a scribe lane 300a of a photo-sensitive layer 300, and the peripheral area 100a on which the correction pattern 101 is formed corresponds to the scribe lane 300a of the photo-sensitive layer 300. In other words, the developed pattern 301 that is transferred from the correction pattern 101 can be formed on the scribe lane 300a of the photo-sensitive substrate 300 aligned to the peripheral area 100a of the lithographic mask 100, after a develop process. The first direction L1 and a reference horizontal direction R1 of the lithographic mask 100 form a substantially 45° angle, the second direction L2 and a reference vertical direction R2 of the lithographic mask form a substantially 45° angle.

In detailed, the first sub-pattern 102 of the correction pattern 101 includes a plurality of parallel strips, such as strips 102a-102d, wherein the strip 102a is separated from the strip 102b with a pitch P1, the strip 102b is separates from the strip 102c with a pitch P2 not equal to the pitch P1, the strip 102c is separated from the strip 102d with a pitch P3 not equal to the pitch P1 and pitch P2. The second sub-pattern 103 includes a plurality of parallel strips, such as strips 103a-103d, wherein the strip 103a is separated from the strip 103b with a pitch P4 substantially equal to the pitch P1, the strip 103b is separated from the strip 103c with a pitch P5 substantially equal to the pitch P2, the strip 103c separates from the strip 103d with a pitch P6 substantially equal to the pitch P3.

In some embodiments, the at least one of the strips 102a-102d of the first sub-pattern 102 and the strips 103a-103d of the second sub-pattern 103 includes a vertical stepped structure 205 including a plurality of sections. For example, FIG. 2B is a partial enlarged view illustrating a vertical stepped structure 105 formed in the first sub-pattern 102 of the correction pattern 101 as depicted in FIG. 2A. In the present embodiment, the strip 102d of the first sub-pattern 102 has a vertical stepped structure 205 including a first section 205a, a second section 205b and a third section 205c connected in series; wherein the first section 205a is connected to and perpendicular to the second section 205b; and the second section 205b is connected to and perpendicular to the third section 205c. The first section 205a extends along a direction parallel to the reference horizontal direction R1 of the lithographic mask 100.

In these embodiments, the presence of the vertical stepped structure 205 of the strip 102d can alleviate the diffraction of the light passing through the lithographic mask 100 during the exposure/development process, to avoid the developed pattern 301 formed on the photo-sensitive layer 300 being deformed.

In some embodiments of the present disclosure, the lithographic mask 100 may include other correction patterns. For example, in the present embodiment, the lithographic mask 100 may further include three correction pattern 101', 101" and 101'". The correction pattern 101' is mirrored and spliced with the correction pattern 101 along a symmetry axis K1 parallel to the first direction L1; the correction pattern 101" is mirrored and spliced with the correction pattern 101 along a symmetry axis K2 parallel to the second direction L2; and the correction pattern 101'" is mirrored and spliced with the correction pattern 101 along the reference vertical direction R2.

Next, referring to step S12 in FIG. 1, at least one exposure/development process is performed to transfer the correction pattern 101 from the lithographic mask 100 to the photo-sensitive layer 300 and then to form a developed pattern 301 on the photo-sensitive layer 300. In the present embodiment, a lithographic tool is used to project energy, such as light bean, charged particles or x-rays, penetrating through the correction pattern 101 from the lithographic mask 100 to form an image onto the photo-sensitive layer 300; and the photo-sensitive layer 300 exposed by the image is then developed. Therefore, the correction pattern 101 of the lithographic mask 100 can be transferred onto the photo-sensitive layer 300 by the image, and the developed pattern 301 can be then formed on the photo-sensitive layer 300 by the development. In other words, the developed pattern 301 corresponds to the correction pattern 101.

FIG. 3 is a top view illustrating a developed pattern 301 transferred from the correction pattern 100 as depicted in FIG. 1 and formed on the photo-sensitive layer 300 according to one embodiment of the present disclosure. In the present embodiment, the developed pattern 301 is formed on the scribe lane 300a and includes a first developed sub-pattern 302 and a second developed sub-pattern 303. The first developed sub-pattern 302 includes a plurality of patterned lines 302a-302d corresponding to the strips 102a-102d of the first sub-pattern 102 respectively. The patterned line 302a is separated from the patterned line 302b for a distance W1; the patterned line 302b is separated from the patterned line 302c for a distance W2; and the patterned line 302c is separated from the patterned line 302d for a distance W3.

The second developed sub-pattern 303 includes a plurality of patterned lines 303a-303d corresponding to the strip 103a-103d of the second sub-pattern 103 respectively. The patterned line 303a is separated from the patterned line 303b for a distance W4; the patterned line 303b is separated from the patterned line 303c for a distance W5; and the patterned line 303c is separated from the patterned line 303d for a distance W6.

After the exposure/development process, the correction pattern 101', 101" and 101'" of the lithographic mask 100 are also transferred onto the photo-sensitive layer 300 to respectively form a developed pattern 301' spliced with the developed pattern 301 along a symmetry axis KD1, a developed pattern 301" spliced with the developed pattern 301 along a symmetry axis KD2, and a developed pattern 301'" spliced with the developed pattern 301 along a symmetry axis KD3.

Thereafter, referring to step S13 in FIG. 1, a first After-Develop-Inspection critical dimension (ADI CD) of the developed pattern 301 is measured using the lithographic tool 31 along a first scanning direction LS1. In some embodiments of the present, the measurement of the first ADI CD of the developed pattern 301 includes using the lithographic tool 31 to project a highly focused electron beam 31a to scan the developed pattern 301 along the first scanning direction LS1; using a detector (not shown) to measure the electron beam scattered by the different materials of the developed pattern 301 and the exposed portion of the photo-sensitive layer 300 to obtain electronic signal; and the first ADI CD of the developed pattern 301 can be obtained by figuring the correlation between the scanning distance and the electronic signal received along the first scanning direction LS1.

In the present embodiment, the step of measuring the first ADI CD of the developed pattern 301 includes steps as follows. The lithographic tool 31 is used to project a highly focused electron beam 31a scanning the first developed sub-pattern 302 along the first scanning direction LS1 to measure the distance W1 separating the patterned lines 302a and 302b, the distance W2 separating the patterned lines 302b and 302c and the distance W3 separating the patterned lines 302c and 302d. Wherein, the first scanning direction LS1 can be (but not limited to) parallel to the extending direction of the distance W1.

Referring to step S14 in FIG. 1, a second ADI CD of the developed pattern 301 is measured using the lithographic tool 31 along a second scanning direction LS2. In the present embodiment, the measurement of the second ADI CD of the developed pattern 301 includes using the lithographic tool 31 project a highly focused electron beam 31a to scan the second developed sub-pattern 303 along the second scanning direction LS2 to measure the distance W4 separating the patterned lines 303a and 303b, the distance W5 separating the patterned lines 303b and 303c and the distance W6 separating the patterned lines 303c and 303d. Wherein the second scanning direction LS2 can be (but not limited to) parallel to the extending direction of the distance W4.

However, the first scanning direction LS1 and the second scanning direction LS2 are not limited thereto. In some embodiments, the first scanning direction LS1 and the second scanning direction LS2 may not parallel to the extending direction of the distance W1 and the extending direction of the distance W4 respectively.

Then, referring to step S15 in FIG. 1, the first ADI CD is subtracted from the second ADI CD to obtain a measurement bias value. In some embodiments of the present disclosure, the step of obtaining the measurement bias value includes subtracting the distance W1 from the distance W4, subtracting the distance W2 from the distance W5, or subtracting the distance W3 from the distance W6. In some other embodiments of the present disclosure, the step of obtaining the measurement bias value includes calculating a first average of the distance W1, the distance W2 and the distance W3; calculating a second average of the distance W4, the distance W5 and the distance W6; and subtracting the first average from the second average.

Subsequently, the exposure conditions or measuring parameters of the lithographic tool 31 are adjusted according to the measurement bias value (referring to step S16 in FIG. 1) for improving the reliability of the ADI CD measurements.

For example, in some embodiment of the present disclosure, the lithographic tool 31 may include an optical measuring tool, a metrology tool having a SEM for performing the ADI CD measurements and/or an optical stepper having an objective lens for projecting images (light) onto the photo-sensitive layer 300. The measuring parameters of the SEM, such as the energy of the electron beams, as well as the exposure conditions of the optical stepper, such as the focal length of the objective lens, the exposure time and the thickness of the photo-sensitive layer 300 can be adjusted according to the measurement bias value. The adjusted conditions and parameters can be input to an OPC and simulation software tool, and the correction results of the ADI CD measurements can be thus verified by the SCD obtained from the OPC.

In accordance with the aforementioned embodiments of the present disclosure, a method for correcting CD measurements of a lithographic tool is provided. A correction pattern having a first sub-pattern and a second sub-pattern intersect with each other is formed on a lithographic mask. After exposure/development, at least two ADI CDs of a developed pattern transferred from the correction pattern and formed on a photo-sensitive layer are measured using the lithographic tool along different scanning directions. A measurement bias value can be obtained by accountings the difference between these two ADI CDs measured along difference scanning directions. Therefore, the exposure conditions and/or measuring parameters of the lithographic tool can be adjusted according to the measurement bias value to alleviate the measurement bias resulted either from the diffraction of the focused electron beam used for measuring the ADI CD or from the developing light used for forming the developed pattern, so as to enhance the processing quality of the lithographic process.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for correcting critical dimension (CD) measurements of a lithographic tool, comprising:
    providing a correction pattern having a first sub-pattern extending along a first direction and a second sub-pattern extending along a second direction on a lithographic mask, wherein the first sub-pattern and the second sub-pattern intersect with each other;
    using the lithographic tool to measure a first After-Develop-Inspection critical dimension (ADI CD) of a developed pattern transferred from the correction pattern and formed on a photo-sensitive layer, along a first scanning direction;
    using the lithographic tool to measure a second ADI CD of the developed pattern along a second scanning direction;
    subtracting the first ADI CD from the second ADI CD to obtain a measurement bias value;
    adjusting exposure conditions and/or measuring parameters of the lithographic tool according to the measurement bias value.

2. The method according to claim 1, wherein the correction pattern is formed on a peripheral area of the lithographic mask corresponding to a scribe lane of the photo-sensitive layer.

3. The method according to claim 1, wherein the first direction and a reference horizontal direction of the lithographic mask form a substantially 45° angle, the second direction and a reference vertical direction of the lithographic mask form a substantially 45° angle.

4. The method according to claim 3, wherein the first sub-pattern comprises a first strip, a second strip and a third strip all substantially extending along the first direction; the first strip is separated from the second strip with a first pitch, the second strip is separated from the third strip with a second pitch not equal to the first pitch; the second sub-pattern comprises a fourth strip, a fifth strip and a sixth strip all extending along the second direction; the fourth strip is separated from the fifth strip with a third pitch and substantially equal to the first pitch, the fifth strip is separated from the sixth strip by a fourth pitch substantially equal to the second pitch.

5. The method according to claim 4, wherein the developed pattern comprises a first developed sub-pattern and a second developed sub-pattern; the first developed sub-pattern comprises a first patterned line, a second patterned line and a third patterned line corresponding to the first strip, the second strip and the third strip respectively, the second developed sub-pattern comprises a fourth patterned line, a fifth patterned line and a sixth patterned line corresponding to the fourth strip, the fifth strip and the sixth strip respectively, the first patterned line is separated from the second patterned line for a first distance; the second patterned line is separated from the third patterned line for a second distance; the fourth patterned line is separated from the fifth patterned line for a third distance; the fifth patterned line is separated from the sixth patterned line for a fourth distance.

6. The method according to claim 5, wherein
    the step of measuring the first ADI CD comprises measuring the first distance and the second distance, and calculating a first average of the first distance and the second distance; and
    the step of measuring the second ADI CD comprises measuring the third distance and the fourth distance, and calculating a second average of the third distance and the fourth distance.

7. The method according to claim 6, wherein the step of obtaining the measurement bias value comprises subtracting the first average from the second average.

8. The method according to claim 4, wherein at least one of the first strip, the second strip, the third strip, the fourth strip, the fifth strip and the sixth strip comprises a vertical stepped structure.

9. The method according to claim 8, wherein the vertical stepped structure comprises a first section, a second section and a third section connected in series; the first section is connected to and perpendicular to the second section; and the second section is connected to and perpendicular to the third section.

* * * * *